United States Patent [19]

Beasom

[11] Patent Number: 5,233,289
[45] Date of Patent: Aug. 3, 1993

[54] VOLTAGE DIVIDER AND USE AS BIAS NETWORK FOR STACKED TRANSISTORS

[75] Inventor: James D. Beasom, Melbourne Village, Fla.

[73] Assignee: Harris Corporation, Melbourne, Fla.

[21] Appl. No.: 689,645

[22] Filed: Apr. 23, 1991

[51] Int. Cl.$^5$ .............................................. G05F 3/24
[52] U.S. Cl. .............................. 323/313; 307/296.6; 330/261; 330/257; 323/315
[58] Field of Search ............... 323/311, 312, 313, 349, 323/315; 307/296.6, 296.7, 296.8; 330/252, 257, 261

[56] References Cited

U.S. PATENT DOCUMENTS

| | | | |
|---|---|---|---|
| 3,723,892 | 3/1973 | Julie | 307/296.7 |
| 3,950,654 | 4/1976 | Broedner et al. | 307/208 |
| 4,464,588 | 8/1984 | Wieser | 307/297 |
| 4,663,584 | 5/1987 | Okada | 323/313 |
| 4,694,199 | 9/1987 | Goetz | 307/296.8 |

FOREIGN PATENT DOCUMENTS

| | | | |
|---|---|---|---|
| 0015342 | 9/1980 | European Pat. Off. | 323/313 |
| 0291062 | 11/1988 | European Pat. Off. | |
| 0321226 | 6/1989 | European Pat. Off. | |

OTHER PUBLICATIONS

B-L Hart. Precision Voltage Divider Circuit, Nov. 18, 1971, pp. 679-680.

Primary Examiner—Steven L. Stephan
Assistant Examiner—Adolf Berhane
Attorney, Agent, or Firm—Barnes & Thornburg

[57] ABSTRACT

A voltage divider including a plurality of series connected depletion mode field effect transistors having their gates and sources biased to operate in saturation mode for the operating range of the divider. Preferably, the gates and sources are connected together. A series resistor adjusts the value of the divider element. A parallel resistor defines the output resistance of the divider element. The voltage divider may be used as a biasing network for stacked transistors. A buffer may be provided between the voltage divider and the control terminal of the stacked transistors. The voltage divider may be used to bias follower stages and the input stages of an operational amplifier.

19 Claims, 2 Drawing Sheets

VOLTAGE DIVIDER AND USE AS BIAS NETWORK FOR STACKED TRANSISTORS

BACKGROUND AND SUMMARY OF THE INVENTION

The present invention relates generally to voltage dividers and more specifically to a unique voltage divider and its application as a biasing circuit for stacked transistors.

The classic voltage divider is composed of a plurality of resistors connected in series. When the resistors are of equal value, voltage at any node is the ratio of that node number with respect to the total. Thus for example, using two equal resistors, the common node is half the voltage applied across the pair of resistors. One limitation of a resistor divider is that the current which flows through the divider circuit varies directly with the voltage applied to the divider. Thus when the divider is subject to a wide range of voltages, a wide range of currents flows therethrough.

In many applications, there is a need for a divider which carries a current substantially independent of the voltage applied across the divider. Thus resistive voltage dividers cannot meet this requirement.

Thus it is an object of the present invention to provide a voltage divider whose current is substantially independent of the voltage provided across the divider.

These and other objects are achieved by forming the voltage divider wherein the plurality of series connected divider elements each include a depletion mode field effect transistor having its gate and source biased to operate in saturation mode for the operating range of the divider. Preferably the gates and source are connected together. A trimmable resistor is provided in series with the source-drain path of each divider element to adjust the value of the divider element. Also, a resistor may be placed in parallel with the source drain path of the divider element and has a smaller resistance than the output resistance of the transistor to thereby define the output resistance of the divider element. The field effect transistors of the divider operating in the saturation mode have a substantially fixed current compared to resistors for variations in voltage applied.

The voltage divider may be used as a biasing network for stacked transistors. The stacked transistors have their conduction paths connected in series and control terminals connected to the voltage divider. The transistors to be biased may include bipolar transistors having their bases as the control terminals connected to the voltage divider or may be a combination of bipolar and field effect transistors. The bases of adjacent bipolar transistors have a divider transistor connected therebetween. The breakdown voltage of the divider transistors is less than the breakdown voltage of the stacked transistors to provide protection of the stacked transistors. A buffer may be provided between the voltage divider and the control terminal of the stacked transistors. The buffer may be a current follower having its own current source or may be a Darlington amplifier. The buffer may also include a capacitor connected to the voltage divider and the control terminal of the stacked transistor to improve frequency response.

The voltage divider may be used in an operational amplifier having first and second inputs. Each of the inputs includes a plurality of series connected first transistors which are connected to a common voltage divider. A control terminal of one of the first transistors in each of the inputs constitutes the input terminal of the respective input of the amplifier. The amplifier includes a first current source connected in common to the first and second input transistors and a second current source connected in parallel with the first current source. The second current source has the same Idss as that of the divider transistors. Alternatively, the first current source, which is connected in common to the first and second transistors, is connected to the voltage divider by a buffer.

Other objects, advantages and novel features of the present invention will become apparent from the following detailed description of the invention when considered in conjunction with the accompanying drawings.

DETAILED DESCRIPTION OF THE DRAWINGS

Figure 1:
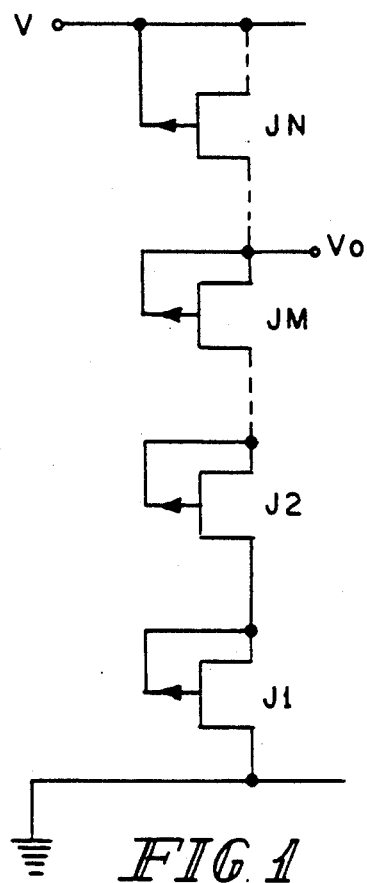
FIG. 1 is a schematic of a voltage divider incorporating the principles of the present invention.

A voltage divider including matched depletion mode field effect transistors connected in series is shown in FIG. 1. The gates of the field effect transistors are connected to their sources. Alternatively, the gates and sources may be biased in another method such that the gate to source voltage operates the field effect transistors in their saturated mode for the expected voltage operation of the divider. Since the FETs are matched, they will each operate at the same voltage. Thus for N FETs in series there is V/N voltage across each FET where V is the voltage applied to the divider. The output taken from the source of the MthFET of the divider has an output voltage $V0 = V(M/N)$.

The current drawn by the divider will be Idss for the FET and will vary only due to the change of voltage across the output resistance of the FET as voltage across the divider is changed. The output resistance of the FET is very large and therefore the current variation, compared to the resistive divider operating at the same current, is very small. As an example, the output and resistance of the field effect transistor is in the order of 1 megaohm and an Idss of 500 microamps at 50 volts. The current at 100 volts increases only 5% from the value of the current at 50 volts across the divider for an FET. The change in current through a resistive divider when the voltage increases from 50 to 100 volts would be a 100% increase.

Figure 2:
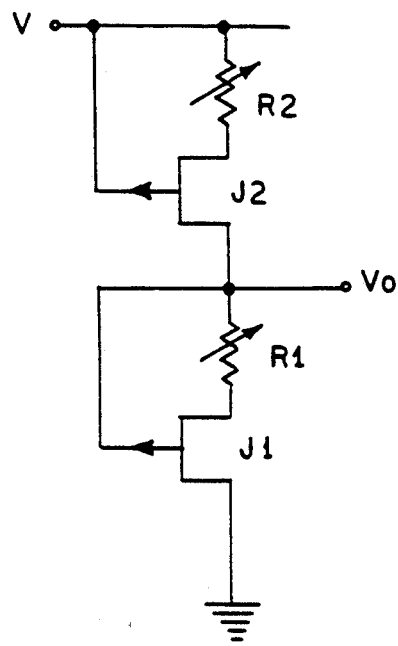
FIG. 2 is a schematic of a voltage divider incorporating the principles of the present invention incorporating trimmable resistors.

To allow adjustment of the individual divider elements in the divider, a variable resistor is illustrated in FIG. 2. The variable resistor is preferably a trimmable resistor connected between the source and the gate connection and is trimmed to set the voltage across each FET in the divider to the same value.

The precision of the division is maximized by using field effect transistors whose output resistance is just large enough to achieve the desired control of the current through the divider. Then, errors due to the mismatch in the Idss are minimized since these mismatches cause variation in the ideal voltage across each FET in the divider.

Figure 3:
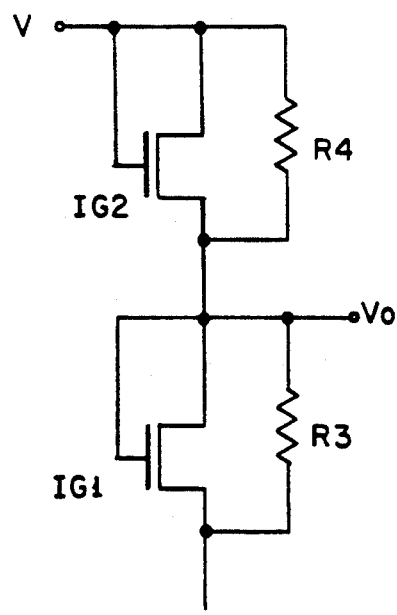
FIG. 3 is a schematic of a voltage divider according to the principles of the present invention including resistors setting the output resistance of the divider.

A method of setting the output resistance with high precision includes placing a resistor in parallel to each of the field effect transistors in the divider. As illustrated in FIG. 3, insulated gate field effect transistors IG1 and IG2 have a resistor R3 and R4 respectively connected in parallel with their source drains. The value of the resistor R3 and R4 is the desired output resistance while the FETs have output resistance much higher than the chosen resistance of R3 and R4.

When voltage is applied to the divider circuit, IG1 and IG2 both operate in their saturated mode. The one with the lower Idss, say IG1, will sustain a larger voltage, assuming R3 and R4 are the same value, because the parallel current paths of IG1 and R3 are in series with the parallel current paths IG2 and R4 and the same current must flow in each element of a series connected current path. The larger voltage across IG1 is also across R3 resulting in larger current flow through R3 than through R4. The difference in voltage between that across IG1, R3 and IG2, R4 will settle at a value such that the difference in current through R3 and R4 due to difference in voltage across them just matches the difference in Idss of IG1 and IG2. Thus both elements will go into saturation.

Figure 4:
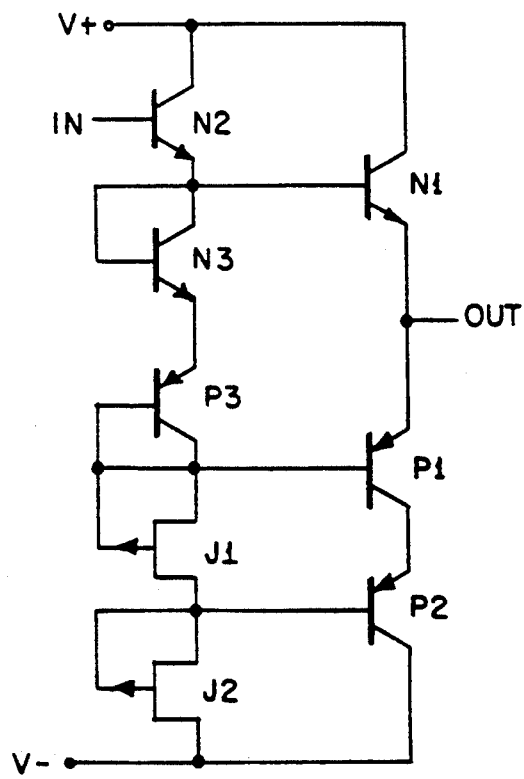
FIG. 4 is a schematic of a stacked emitter follower using the divider according to the principles of the present invention.

One application of the improved divider circuit is as a biasing network for stacked bipolar transistors as illustrated in FIG. 4. The stacked bipolar transistors P1 and P2 are connected between the output and V−. The voltage divider includes junction field effect transistors J1 and J2 connected in series between the control gate or base of P1 and V−. P1 and P2 provide twice the voltage capacity of one transistor alone in the output stage of an operational amplifier. N1 is also connected between the output and V+. The input is provided to the base of N2 whose emitter is connected to the base of N1. Transistors N3 and P3 are connected in series in their collector emitter path between the base of N1 and P1 and have their bases connected to their collectors. The divider of J1 and J2 divides the input voltage less 3VBE's. This voltage is applied totally to the base of P1 and half of it is applied to the base of P2. Thus the voltage from the collector to the bases of each of the transistors P1 and P2 have half of the input voltage applied thereacross so that the circuit can operate to twice the BVCBO of the PNP transistors P1 and P2.

If the PNP followers P1 and P2 sink a large current from the output load, the base current of P2 may cause the divider action to deviate from the desired division in the same way Previously described for the variation of the average Idss. Such an error causes voltage across J2 to be larger than that across J1. To assure that the PNP breakdown voltage of P1 and P2 would not be exceeded in such a situation, the field effect transistors J1 and J2 of the voltage divider would be selected with a breakdown less than that of the PNPs P1 and P2 so that the field effect transistors J1 and J2 act as a zener diode before P2 breaks down, thereby protecting it.

Figure 5:
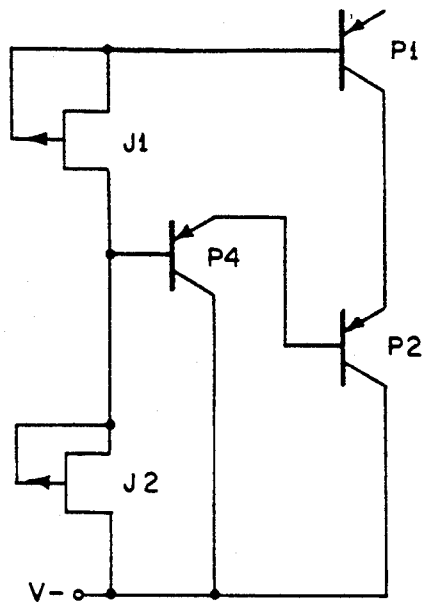
FIG. 5 is an emitter follower including a Darlington amplifier buffer according to the principles of the present invention.

Another method of reducing error resulting from base current is to use as Darlington connection as illustrated in FIG. 5. Transistor P4 has its base connected to the juncture J1 and J2 of the voltage divider, its emitter connected to the base of P2 and its collector connected to the collector of P2. This acts to limit current to the divider node between J1 and J2. The Darlington connection is considered a buffer.

Figure 6:
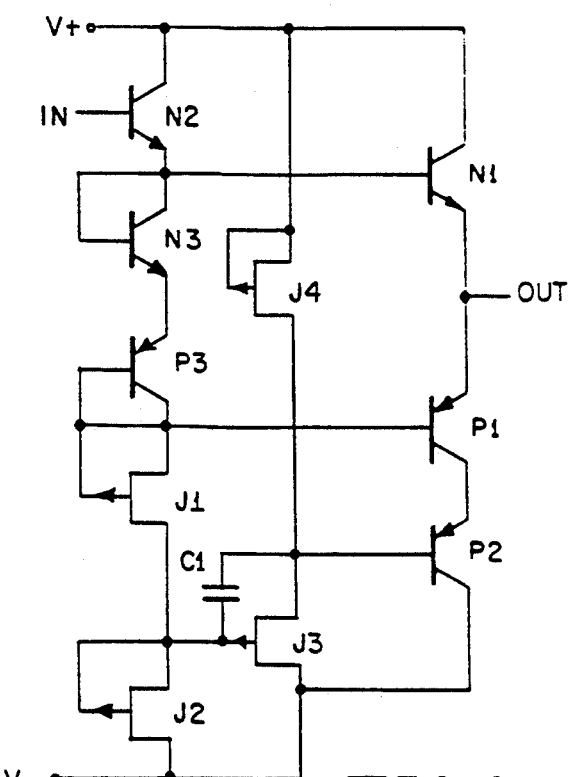
FIG. 6 is a schematic of an emitter follower including a voltage following buffer according to the principles of the present invention.

Another buffer used to preserve the accuracy of the divider is illustrated in FIG. 6. It includes a source follower J3 having its gate connected to the juncture of J1 and J2 in the voltage divider and its source connected to the base of P2. A current source, illustrated as a field effect transistor J4, connects V+ to the source of J3. Capacitor C1 is connected as a gate-source capacitor to improve the frequency response.

It should be noted that although J4 is shown as the current source for the follower J3, other types of current sources may be used. It should also be noted that the stacked transistors in FIGS. 4-6 have been illustrated as bipolar PNPs, and they also may be NPNs. The stack may include more than two transistors. If they do include more than two, the divider would also include more than two elements. Preferably the number of field effect transistors in the divider matches the number of stacked transistors such that one divider field effect transistor is connected between the control of adjacent stacked transistors. Although P channel devices have been illustrated in the figures, N channel devices may also be used. The devices may be insulated gate field effect transistors as well as the junction field effect transistors. If the stacked transistors P1 and P2 are of different capacities, the capacity of the field effect transistors J1 and J2 in the voltage divider can also be changed to match the capacities of P1 and P2. Alternatively, if P2 is twice the breakdown of P1, a pair of J2s of equal breakdown to J1 may be provided to produce the appropriate portioning within the voltage divider.

Figure 7:
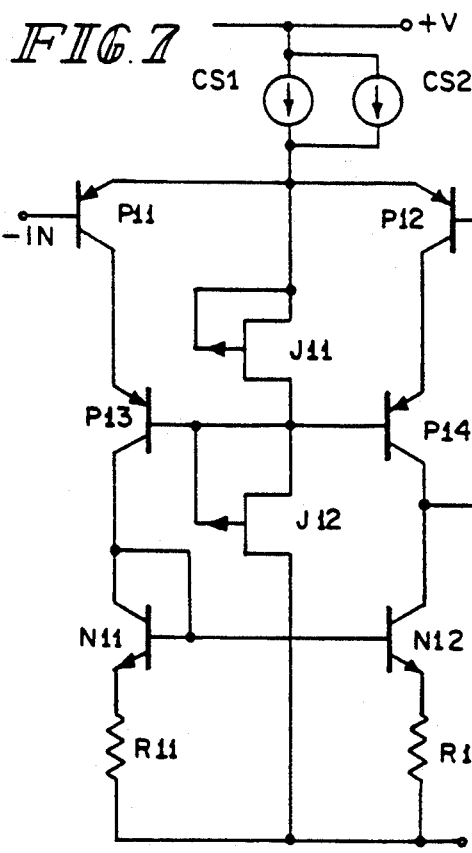
FIG. 7 is a schematic of an amplifier incorporating a divider according to the principles of the present invention.

In addition to the biasing of followers, the voltage divider may also be used for the differential pair such as input devices of an operational amplifier, as illustrated in FIG. 7. The differential inputs are provided to the bases of P11 sand P12 respectively. Stacked transistors P13 and P14 have their collector-emitter path connected in series to the collector emitter path of a respective input transistor P11 and P12. The differential input path of P11, P13 and P12, P14 are connected to −V by transistor N11 and resistor R11 and transistor N12 and resistor R12 respectively. A singled-ended output is taken from the collector of N12. A common current source CS1 is connected to the emitters of the input transistors P11 and P12.

A common divider for the stacked transistors P11, P13 and P12, P14 includes field effect transistors J11 and J12. J11 is connected between the emitter of P11, P12 and the bases of P13, P14 and J12 is connected between the bases of P13, P14 and V−. As with the follower, this allows the input to have greater voltage capacity than the breakdown of a single device P11, P12. To allow the current source CS1 to be independent of the field effect transistors Idss, a second current source CS2 is connected in parallel with CS1. The current source CS2 is set to the Idss of the dividers J11 and J12.

Figure 8:
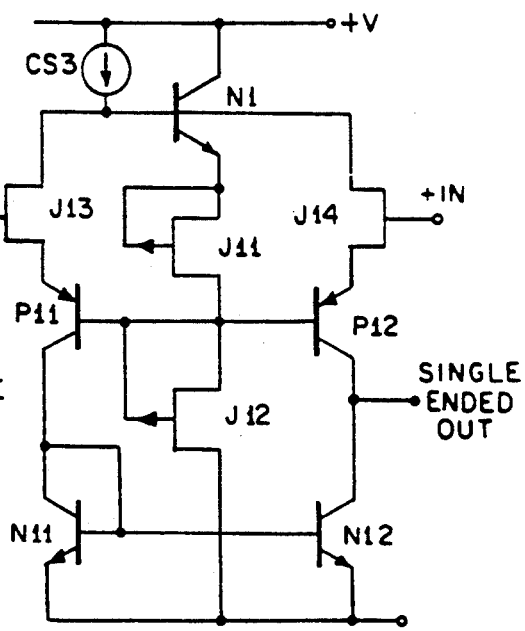
FIG. 8 is a schematic of the input stage of an operation amplifier including a voltage divider according to the principles of the present invention.

Although these stacked transistors in the previous figures have shown stacked transistors of the same type, the transistors in the stack may be a combination of bipolar and field effect transistors. As illustrated in FIG. 8, input transistors are field effect transistors J13 and J14 stacked with bipolar transistors P11 and P12 respectively. Another feature illustrated in FIG. 8 is a buffer N1 connecting the current source CS3 to the divider. N1 has its collector connected to V+, its base connected to CS3 and its emitter connected to the voltage divider. This buffers the current source CS3 from the Idss of the voltage dividers J11 and J12.

Although the present invention has been described and illustrated in detail, it is to be clearly understood that the same is by way of illustration and example only, and is not to be taken by way of limitation. The spirit and scope of the Present invention are to be limited only by the terms of the appended claims.

What is claimed is:

1. In a circuit including a plurality of first transistors having their conduction path connected in series between first and second terminals and having control terminals connected to a voltage divider which includes a plurality of divider elements, the improvement comprising:
   each of said divider elements including a divider depletion mode field effect transistor having a gate, a source and a drain and being connected in series by their sources and drains; and
   each divider transistor being sized to operate in their saturation mode for the operating range of said voltage divider and having a constant fraction of the total voltage across said voltage divider occurring across the divider transistor.

2. A circuit according to claim 1 wherein said divider elements each include a resistor in series with its source-drain path to allow adjustment of the divider element.

3. A circuit according to claim 1 wherein said first transistors are bipolar transistors having their bases as control terminals connected to said voltage divider.

4. A circuit according to claim 3 wherein said bases of adjacent bipolar transistors have a divider transistor connected therebetween.

5. A circuit according to claim 1 wherein said divider transistors have a breakdown voltage less than the breakdown voltage of said first transistors.

6. A circuit according to claim 1 including a buffer having an input connected to said voltage divider and an output connected to said control terminal of said first transistor.

7. A circuit according to claim 6 wherein said buffer is a voltage follower.

8. A circuit according to claim 6 wherein said buffer includes a capacitor connected between said buffer's input and output.

9. A circuit according to claim 6 wherein said buffer is a Darlington connected transistor.

10. A circuit according to claim 1 wherein said circuit is a differential pair having a first and second inputs each having a plurality of said series connected first transistors connected to a common voltage divider; and the control terminal of one of the first transistors is the input terminal of a respective input of said differential pair.

11. A circuit according to claim 10 wherein said differential pair includes a first current source connected in common to said first and second input transistors and a second current source connected in parallel with said first current source; and said second current source having approximately the same Idss as that of said divider transistors.

12. A circuit according to claim 10 wherein said differential pair includes a first current source connected in common to said first and second input transistors and a buffer connecting said connection of said first current source to said first and second input transistors to said voltage divider.

13. A circuit according to claim 1 wherein said plurality of first transistors includes bipolar and field effect transistors connected in series.

14. A circuit according to claim 1 wherein said divider transistors are of the same conductivity type.

15. In a circuit including a plurality of first transistors having their conduction path connected in series between first and second terminals and having control terminals connected to a voltage divider which includes a plurality of divider elements, the improvement comprising:
   each of said divider elements including a divider depletion mode field effect transistor having a gate, a source and a drain and being connected in series by their sources and drains;
   said gate and source of a respective divider transistor being connected together; and
   said divider transistors being sized to operate in their saturation mode for the operating range of said voltage divider.

16. A circuit according to claim 14 wherein said divider elements each include a resistor with its source-drain path and connected between its gate and source.

17. A circuit according to claim 15 wherein said divider transistors are of the same conductivity type.

18. A circuit according to claim 17 wherein said transistor has a smaller resistance than the output resistance of the divider transistor.

19. In a circuit including a plurality of first transistors having their conduction path connected in series between first and second terminals and having control terminals connected to a voltage divider which includes a plurality of divider elements, the improvement comprising:
   each of said divider elements including a divider depletion mode field effect transistor having a gate, a source and a drain and being connected in series by their sources and drains;
   said gate and source of a respective divider transistor being connected together; and
   a resistor connected in parallel with the source-drain path of each respective divider transistor.

* * * * *